United States Patent
Jiang

(10) Patent No.: US 9,331,370 B1
(45) Date of Patent: May 3, 2016

(54) MULTILAYER INTEGRATED CIRCUIT PACKAGES WITH LOCALIZED AIR STRUCTURES

(71) Applicant: Altera Corporation, San Jose, CA (US)

(72) Inventor: Xiaohong Jiang, San Jose, CA (US)

(73) Assignee: Altera Corporation, San Jose, CA (US)

( * ) Notice: Subject to any disclaimer, the term of this patent is extended or adjusted under 35 U.S.C. 154(b) by 395 days.

(21) Appl. No.: 13/829,883

(22) Filed: Mar. 14, 2013

(51) Int. Cl.
*H01P 1/00* (2006.01)
*H01P 3/08* (2006.01)
*H01P 11/00* (2006.01)

(52) U.S. Cl.
CPC ............... *H01P 1/005* (2013.01); *H01P 3/081* (2013.01); *H01P 3/082* (2013.01); *H01P 11/006* (2013.01)

(58) Field of Classification Search
CPC ........... H01L 23/66; H01P 3/08; H01P 3/081; H01P 3/082; H01P 11/006; H01P 1/005; H01P 1/00
USPC ......................................... 333/238, 246–247
See application file for complete search history.

(56) References Cited

U.S. PATENT DOCUMENTS

| | | | |
|---|---|---|---|
| 4,739,448 A * | 4/1988 | Rowe et al. | .................... 361/719 |
| 7,205,613 B2 | 4/2007 | Fjelstad et al. | |
| 7,253,495 B2 | 8/2007 | Sutardja | |

FOREIGN PATENT DOCUMENTS

EP 1186212 2/2006

OTHER PUBLICATIONS

Chisca, S. et al, "Dielectric and Conduction Properties of Polyimide Films", 2011, IEEE, p. 253-256.*
Wong et al., U.S. Appl. No. 12/909,739, filed Oct. 21, 2010.

* cited by examiner

*Primary Examiner* — Benny Lee
*Assistant Examiner* — Albens Dieujuste
(74) *Attorney, Agent, or Firm* — Treyz law Group, P.C.; Jason Tsai

(57) ABSTRACT

Integrated circuit packages with stripline structures are provided. An integrated circuit package substrate may include a core layer having top and bottom surfaces and dielectric layers formed on the top and bottom surfaces of the core layer. Stripline structures may be formed in at least some of the dielectric layers. A stripline trace may include signal routing conductors sandwiched between top and bottom ground planes. In particular, a dielectric layer may be formed between the signal conductors and the bottom ground plane to support the signal conductors, whereas a localized air region may be formed over the signal routing conductors separating the signal conductors from the top ground plane. If desired, the region above the signal routing conductors between the top ground plane and the signal routing conductors may be filled using other types of material having low loss and/or a dielectric constant that is frequency independent.

18 Claims, 7 Drawing Sheets

MULTILAYER INTEGRATED CIRCUIT PACKAGES WITH LOCALIZED AIR STRUCTURES

BACKGROUND

An integrated circuit (IC) package generally includes, among others, a substrate and a die placed on the substrate. The die is generally coupled to the substrate through wire bonds or solder bumps. Signals from the integrated circuit die may then travel through the wires or solder bumps to external circuitry through the substrate.

A package substrate is typically formed using low cost organic buildup material such as the ABF-GX13 insulation film material available from Ajinomoto. Transmission line structures such as striplines are commonly formed in the package substrate to provide good isolation between adjacent high-speed channels (i.e., channels transmitting at greater than 10 Gbps). In particular, the stripline is uniformly filled with the buildup material (i.e., each surface of a stripline signal conductor is in direct contact with the buildup material).

Buildup material such as ABF-GX13, however, exhibits undesirable properties when supporting high-speed data transmission. For example, the ABF-GX13 material is fairly lossy (i.e., energy associated with transmitted signals is likely to be absorbed by this lossy material) and exhibits a dielectric constant that varies with frequency (i.e., ABF-GX13 is dispersive). As a result, data conveyed through such types of striplines tend to exhibit high intersymbol interference (IS) jitter, which limits the trace length of striplines that are used for high-speed data transmission.

SUMMARY

Methods for fabricating integrated circuit (IC) packages are provided. In one suitable arrangement, methods for forming an IC package substrate may include forming a first dielectric layer, forming signal routing conductors on the first dielectric layer, and forming a second dielectric layer on the first dielectric layer, where the second dielectric layer includes a region that is devoid of dielectric material and that is formed over the signal routing conductors. The region may be left unfilled (e.g., the region may be a localized air region) or may be filled using additional material that attenuates energy less than the first dielectric layer and/or has a dielectric constant that varies with frequency less than that of the first dielectric layer.

A first ground plane may be formed below the first dielectric layer, whereas a second ground plane may be formed on the second dielectric layer. The first and second ground planes may be shorted by rows of vias that run parallel to the signal routing conductors (e.g., the vias are arranged in a path that runs parallel to the signal routing conductors). The signal routing conductors may therefore be sandwiched between the first and second ground planes and may collectively form a stripline structure. The second ground plane may overlap and cover the region in the second dielectric layer to form a localized air region (as an example). If desired, additional ground planes may be formed on the first dielectric layer to laterally surround the signal routing conductors to form a co-planar structure. If desired, the package substrate may include stripline structures with similar void regions formed in other layers of the package substrate.

In some arrangements, alignment holes may be formed in the first dielectric layer and alignment pins may be inserted in the alignment holes of the first dielectric layer. Alignment holes may also be formed in the second dielectric layer. When forming the second dielectric layer on top of the first dielectric layer, the alignment holes in the second dielectric layer may be aligned to the alignment pins to ensure that the localized air region overlaps with the signal routing conductors.

Further features of the present invention, its nature and various advantages will be more apparent from the accompanying drawings and the following detailed description.

DETAILED DESCRIPTION

Embodiments of the present invention relate to integrated circuits and, more particularly, to integrated circuit packages. An integrated circuit package may include a substrate on which at least one integrated circuit is mounted. In some applications, integrated circuits may output high-speed signals that are conveyed to external circuitry via transmission line paths formed in the package. Conventional package substrates are formed using material that limits the high-speed performance of the transmission line paths. It will be recognized by one skilled in the art that the present exemplary embodiments may be practiced without some or all of these specific details. In other instances, well-known operations have not been described in detail in order not to unnecessarily obscure the present embodiments.

Figure 1:
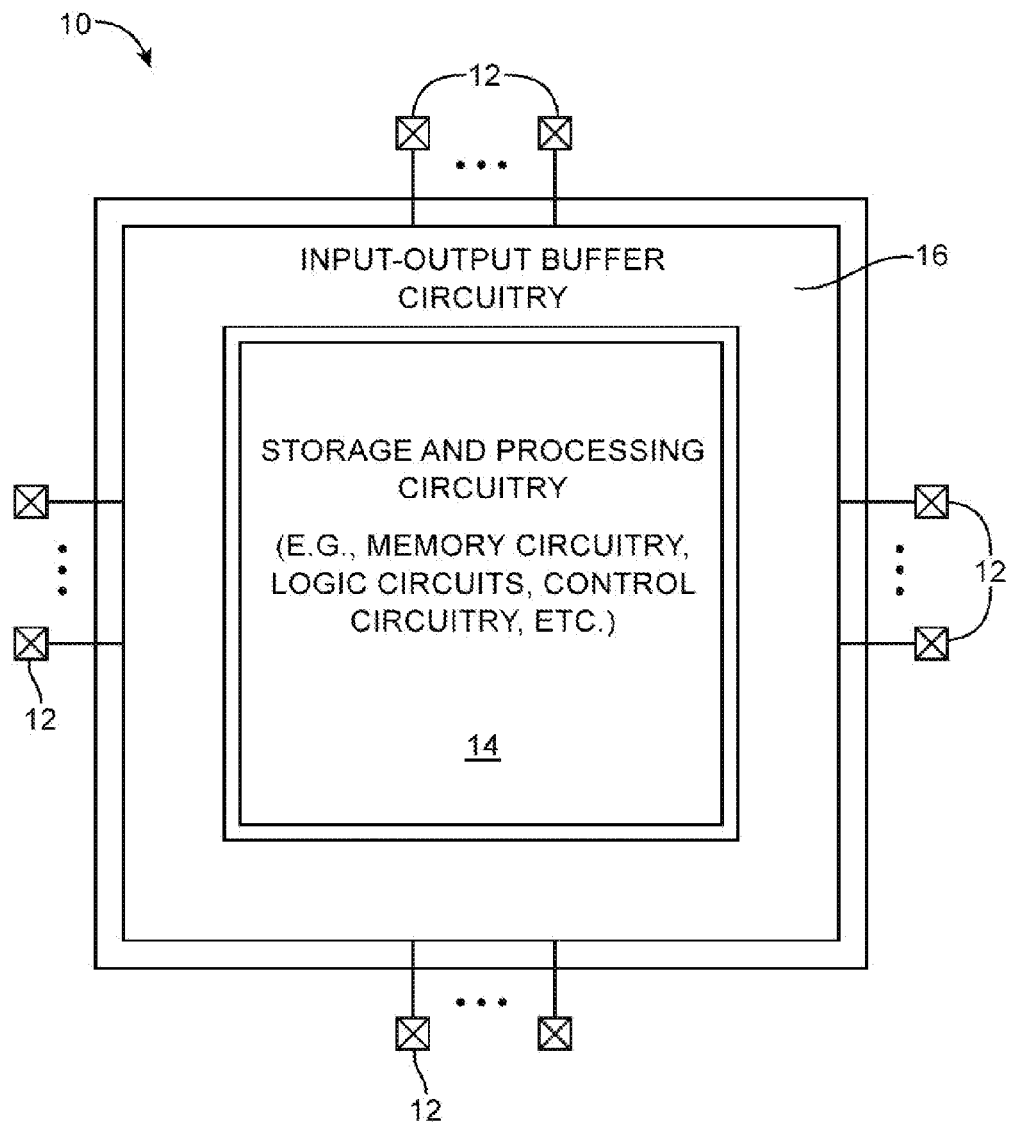
FIG. 1 is a diagram of an illustrative integrated circuit with input-output buffer circuitry in accordance with an embodiment of the present invention.

FIG. 1 shows an integrated circuit 10 that includes internal circuitry such as storage and processing circuitry 14. Integrated circuit 10 may be a memory chip, a digital signal processor (DSP), a microprocessor, an application specific integrated circuit (ASIC), or a programmable integrated circuit. Examples of programmable integrated circuits include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few. Storage and processing circuitry 14 may include memory circuitry, logic circuits, arithmetic circuits, and/or other (digital or analog) control circuitry that serve to implement the desired function of integrated circuit 10.

As shown in FIG. 1, device 10 may include input-output (I/O) circuitry such as I/O buffer circuitry 16 formed along each edge of device 10. Circuitry 16 may be used for driving signals off of device 10 and for receiving signals from other devices via I/O pins 12. For example, input-output buffer circuitry 16 may include output buffer circuits for driving signals off of device 10 to external circuitry and may include input buffer circuits for receiving signals from the external circuitry.

Figure 2:
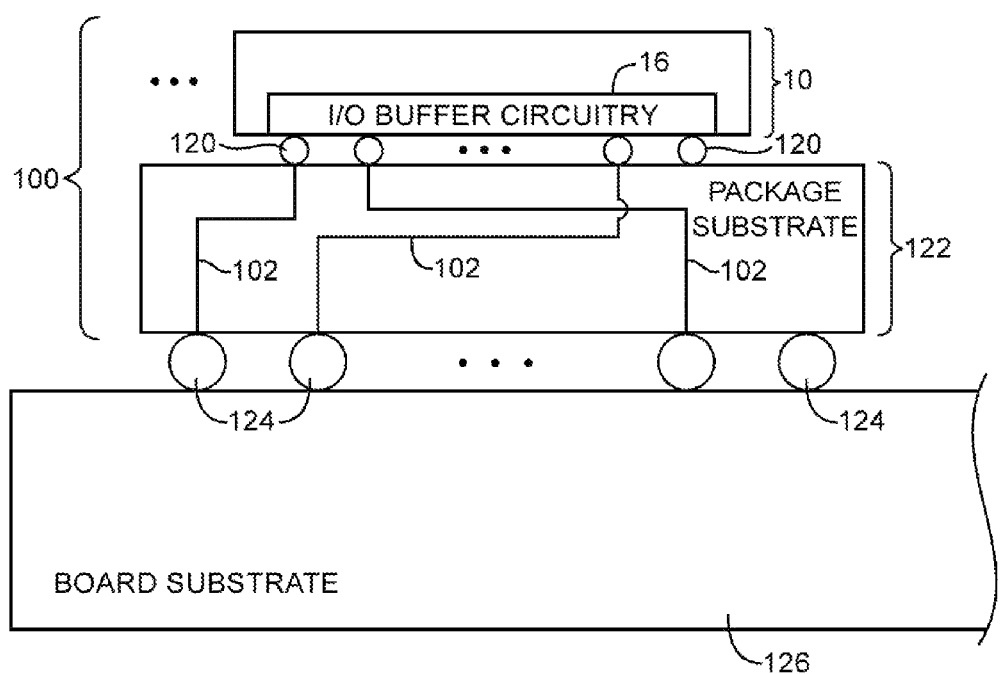
FIG. 2 is a cross-sectional side view of an illustrative integrated circuit package in accordance with an embodiment of the present invention.

Integrated circuit dies are often contained within an integrated circuit package. FIG. 2 is a cross-sectional side view of an illustrative integrated circuit (IC) package 100. As shown in FIG. 2, package 100 may include a package substrate such as package substrate 122 and at least one integrated circuit die 10 mounted on top of package substrate 122. This single-chip package configuration is merely illustrative. If desired, package 100 may include multiple integrated circuit dies mounted laterally with respect to one another on top of package substrate 122 and/or multiple integrated circuit dies stacked vertically with respect to one another over package substrate 122. In general, a multichip package may include any number of dies stacked on top of one another and dies arranged laterally with respect to one another. In such multichip package configurations, an interposer structure may be formed between the package substrate and the associated dies.

Referring still to FIG. 2, package substrate 122 may be coupled to board substrate 126 via solder balls 124. As an example, solder balls 124 may form a ball grid array (BGA) configuration for interfacing with corresponding conductive pads on substrate 126. Substrate 126 may be a printed circuit board (PCB) on which package 100 and other single-chip or multichip packages are mounted.

Die 10 may be formed using a semiconductor substrate (e.g., a p-type silicon substrate) having a first surface, a second surface, and interconnect layers formed on the first surface of the die substrate. Device structures such as transistor gate structures, capacitor plate structures, resistive load structures, density-compliance structures, and other device structures (e.g., I/O buffer circuitry 16) may be formed at the interface where the interconnect layers meet the first surface of the die substrate. The interconnect layers are sometimes referred to collectively as a dielectric stack.

The first surface on which the dielectric stack formed is typically referred to as the "upper" surface of the die substrate. The configuration as shown in FIG. 2 in which the upper surface is facing downwards towards package substrate 122 is therefore sometimes referred to as a "flip-chip" configuration, because each die 10 is inverted/flipped from its upright orientation.

Die 10 may be coupled to package substrate 122 via flip-chip bumps 120. Bumps 120 may refer to solder bumps that are formed on the uppermost layer of the dielectric stack (e.g., bumps 120 may be deposited on aluminum pads that are formed at the uppermost layer of the dielectric stack). Bumps 120 that interface directly with package substrate 122 may sometimes be referred to as controlled collapse chip connection (C4) bumps and may each have a diameter of 100 µm (as an example).

Conductive paths such as signal routing paths 102 may be formed in package substrate 122 for connecting flip-chip bumps 120 to solder balls 124. Signals output from I/O buffer circuitry 16 may be driven off of device 10 through C4 bump(s) 120, package routing path(s) 102, and solder ball(s) 124 in that general order to other circuitry on or coupled to board 126. Signals arriving from other external circuitry may be conveyed through solder ball(s) 124, signal routing path(s) 102, and C4 bump(s) 120 in that general order and may be received using I/O buffer circuitry 16.

Signal routing paths 102 formed in package substrate 122 may be transmission line structures that are formed using one or more microstrip transmission lines, stripline transmission lines, edge-coupled microstrip transmission lines, edge-coupled stripline transmission lines, or other suitable transmission line structures. Transmission line structures such as the stripline structure provides good isolation between adjacent traces (compared to the microstrip arrangement) and is therefore suitable for use in supporting high-speed data transmission (e.g., the stripline transmission line medium may be used for routing signals in high-speed channels with data rates of more than 10 Gbps, more than 20 Gbps, more than 30 Gbps, etc.).

Figure 3:
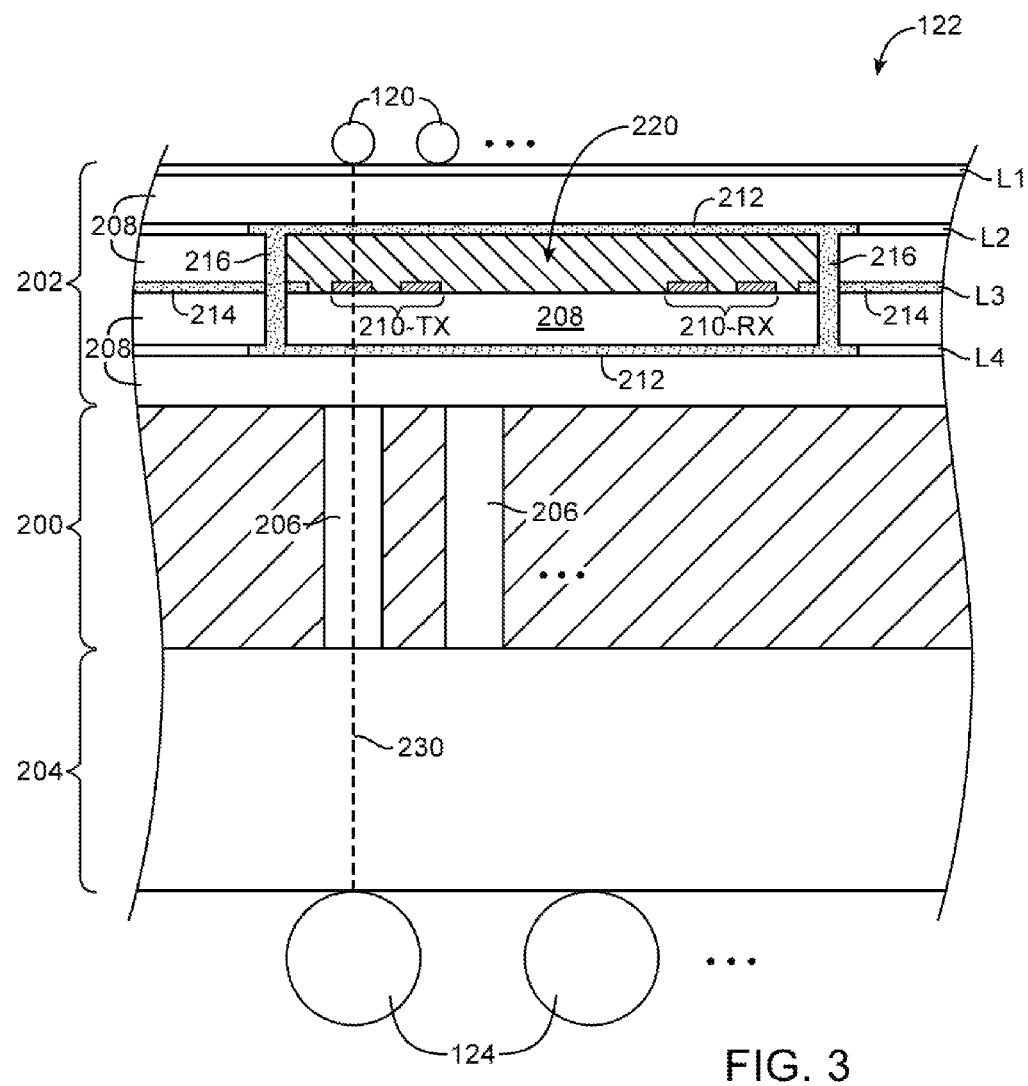
FIG. 3 is a cross-sectional side view of an illustrative integrated circuit package substrate with a localized air layer formed over striplines in accordance with an embodiment of the present invention.

FIG. 3 is a cross-sectional side view of package substrate 122 that includes stripline transmission lines (e.g., stripline transmit signal conductors 210-TX and receive signal conductors 210-RX). As shown in FIG. 3, package substrate 122 may include a core layer 200 having a top surface and a bottom surface, dielectric layers 202 formed at the top surface of core layer 200, and dielectric layers 204 formed at the bottom surface of core layer 200. Conductive vias, sometimes referred to as plated through holes (PTH), 206 may be formed through core layer 200 to couple conductive paths in dielectric layers 202 to conductive paths in dielectric layers 204. Dielectric layers 202 and 204 may sometimes be referred to as "buildup" layers.

Core layer 200 may serve as a carrier layer that provides sufficient mechanical support for package substrate 122. Core layer 200 may be formed from fiberglass-filled epoxy, polyimide, resin, plastic, or other types of dielectric material. Core layer 200 is generally much thicker than dielectric layers 202 and 204. As an example, core layer 200 may be 800 µm thick, whereas each layer in dielectric layers 202 and 204 may be 30 µm thick.

Dielectric layers 202 may include alternating layers of metal routing layers (e.g., dielectric layers in which metal routing paths can be formed) and micro via layers (e.g., dielectric layers through which micro vias can be formed for electrically connecting paths from one metal routing layer to paths in another metal routing layer). The vias formed in the micro via layers may be substantially smaller than the plated through holes formed in core layer 200. In the example of FIG. 3, layers 202 may include metal routing layers L1-L4 separated by via layers 208 (e.g., a via layer 208 may be interposed between each respective pair of adjacent metal routing layers). In general, package substrate 122 may include any number of metal routing layers and via layers. The number via layers 202 may be the same or different as the number of via layers 204. Package substrate 122 of this arrangement may sometimes be referred to as a multilayer IC package.

Signal routing paths in the metal routing layers and conductive vias in the via layers of dielectric layers 202 may be formed using aluminum, copper, silver, gold, combinations of these materials, or other suitable conductive material. The dielectric material that at least partly surround the signal routing paths and the conductive vias in dielectric layers 202 may be formed from ABF-GX13 available from Ajinomoto or other suitable dielectric/buildup material.

Stripline signal conductors (or traces) 210 may be formed in at least one metal routing layer in package substrate 122. As shown in FIG. 3, a first pair of differential signal traces 210-TX and a second pair of differential signal traces 210-RX may be formed in metal routing layer L3. Traces 210-TX may serve as a differential channel for use in transmitting data that is output from integrated circuit 10, whereas traces 210-RX may serve as a differential channel for use in receiving data for integrated circuit 10. For example, signals output from integrated circuit die 10 mounted on top of package substrate 122 may travel through flip-chip bump 120, signal routing path 210-TX, plated through hole 206, and solder ball 124 to corresponding traces on PCB 126 (as indicated schematically by signal path 230).

An upper ground plane 212 may be formed in metal routing layer L2 over signal traces 210, whereas a lower ground plane 212 may be formed in metal routing layer L4 below signal traces 210 (e.g., signal traces 210 may be vertically sandwiched between the upper and lower ground planes 212). Ground planes such as ground planes 214 may also be formed in metal routing layer L3 to laterally surround the signal traces 210 (e.g. ground planes 214 may be formed in the same metal routing layer in which stripline traces 210 are formed).

Figure 4:
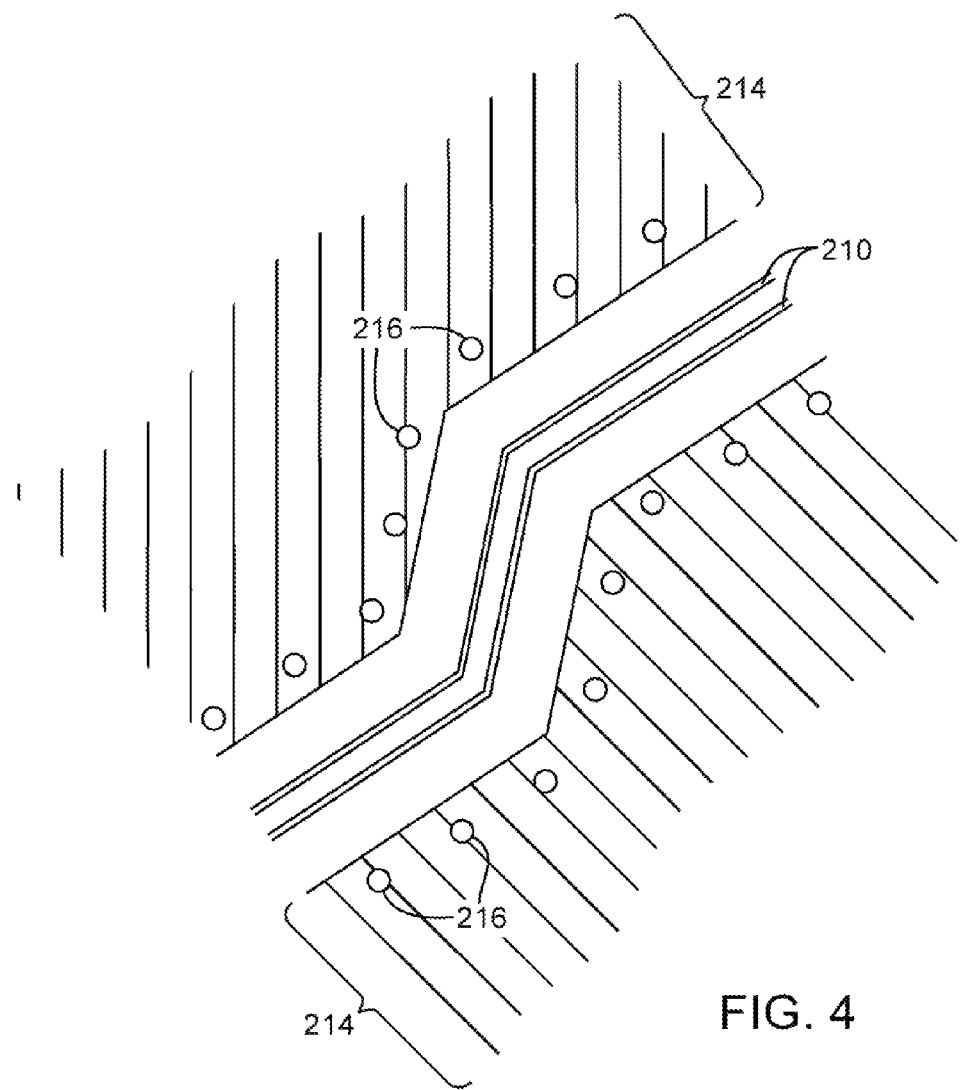
FIG. 4 is a top view of a differential stripline trace surrounded by grounding conductors in accordance with an embodiment of the present invention.

The upper and lower ground planes 212 may be shorted together by a row of conductive vias 216 formed through a via layer 208 that separates metal routing layers L2 and L3 and a via layer 208 that separates metal routing layers L3 and L4 to improve signal propagation performance (see, e.g., FIG. 4). FIG. 4 shows a top view of an illustrative stripline trace pair 210 that is surrounded by lateral grounding planes 214 and rows of shorting vias 216 (e.g., the rows of shorting vias 216 may run parallel to the signal routing conductors 210 on each side). Parallel ground planes 212 are positioned above and below the signal trace pair 210 and are not shown in FIG. 4 for clarity. Transmission lines formed in the stripline configuration exhibit good channel isolation and are therefore suitable for use in high-speed data transmission (e.g., for transmitting data at 10 Gbps, 20, Gbps, 30 Gbps, 100 Gbps, etc.).

Buildup material such as the ABF-GX13 insulation film material may be fairly lossy (i.e., ABF-GX13 attenuates or dissipates an undesirable amount of energy) and exhibits a dielectric constant that varies with frequency. Material with a dielectric constant that varies with frequency is sometimes referred to as being "dispersive." Conventional stripline structures are uniformly filled with this lossy and dispersive buildup material (i.e., a conventional stripline structure is filled completely with ABF-GX13). Stripline structures formed in the conventional approach tend to exhibit high intersymbol interference (ISI) jitter, which can severely limit the maximum trace length of each stripline and therefore the input-output channel count.

In an effort to counteract the effects of the lossy and dispersive buildup material, high-speed signal transmission lines may be formed using a non-uniform/asymmetric stripline structure. Referring back to FIG. 3, signal conductors 210 may be formed on dielectric buildup material 208. The dielectric layer that is formed on top of traces 210, however, may only be partially filled with the buildup material so that a localized air region 220 is formed at the stripline traces. Region 220 may sometimes be referred to as a localized air structure, air layer, or void (e.g., region 220 may be devoid of any dielectric buildup material). This stripline configuration in which one side of the stripline is filled with buildup material while the other side of the stripline is occupied with air is sometimes referred to as an "asymmetric" stripline structure. Dielectric stack 202 formed with a void is sometimes referred to as being "partially filled."

In comparison to ABF-GX13, air is much less lossy and exhibits a dielectric constant that is frequency independent. The presence of air (or equivalently the absence of ABF-GX13) directly on top of the signal conductors can therefore help improve the effective material loss and dispersion of the overall asymmetric stripline structure. In comparison to conventional package substrate stripline structures, the stripline structure of FIG. 3 exhibits reduced material loss and dispersion. As a result, ISI jitter can be reduced, which allows for longer trace lengths to be formed on the package substrate and allows for increased channel density when supporting high-speed data transmission.

Package substrate 122 of FIG. 3 is merely illustrative and does not serve to limit the scope of the present invention. If desired, materials other than air that exhibits low loss and relatively steady dielectric constant may be filled in localized void region 220 (e.g., region 220 may be filled using material that dissipates energy less and whose dielectric constant varies with frequency less than the remainder of the buildup insulating material that forms the majority of dielectric layers 202 and 204). If desired, dielectric layers 204 may include metal routing layers and via layers of the type described in connection with dielectric layers 202. Signal traces 210 may be formed in more than one metal routing layer within package substrate 122 (e.g., transmit stripline traces 210-TX may be formed in one metal routing layer, whereas receive stripline traces 210-RX may be formed in another metal routing layer). If desired, stripline traces 210 may also be formed in dielectric layers 204. In general, any number of single-ended or differential high-speed channels may be formed as stripline traces on package substrate 122.

Figure 5:
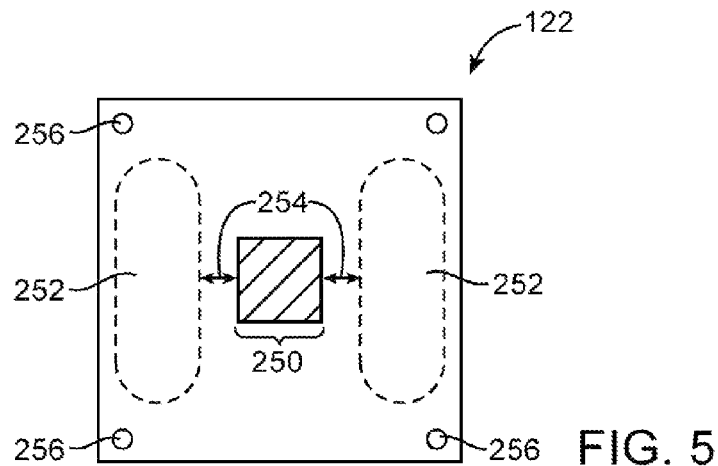
FIG. 5 is a top view of an illustrative package substrate showing regions in which high-speed stripline traces are formed in accordance with an embodiment of the present invention.

The localized air regions 220 may be formed at high-speed channel routing regions on package substrate 122. FIG. 5 shows a top view of package substrate 122. As shown in FIG. 5, package substrate 122 may include an integrated circuit die landing region 250 and associated high-speed channel routing regions 252. Die landing region 250 may be configured to receive a corresponding integrated circuit die 10 (e.g., die 10 may be mounted on package substrate 122 on die landing region 250). High-speed signal routing paths formed using the stripline structure of FIG. 3 may be formed in regions 252 (as an example). The high-speed signal routing paths may be coupled to die 10 via traces 254.

Figure 6:
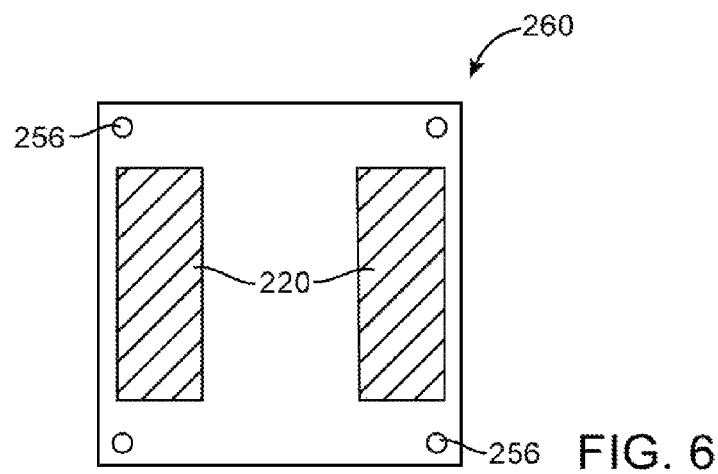
FIG. 6 is a top view of a layer in the package substrate of FIG. 5 that includes unfilled regions aligned to the high-speed stripline regions in accordance with an embodiment of the present invention.

To ensure that the localized air regions 220 are properly positioned on package substrate 122, alignment holes 256 may be formed in at least some of the dielectric layers in package substrate 122. For example, a dielectric layer 260 that is subsequently formed on top of a metal routing layer with high-speed stripline signal conductors 210 may also include alignment holes 256 for ensuring that void regions 220 in layer 260 are aligned to the high-speed channel routing regions 252 (see, e.g., FIG. 6). As shown in FIG. 6, alignments holes 256 in layer 260 ensures that the localized air regions 220 are properly aligned with regions 252 at which the high-speed stripline routing traces are formed.

Figure 7:
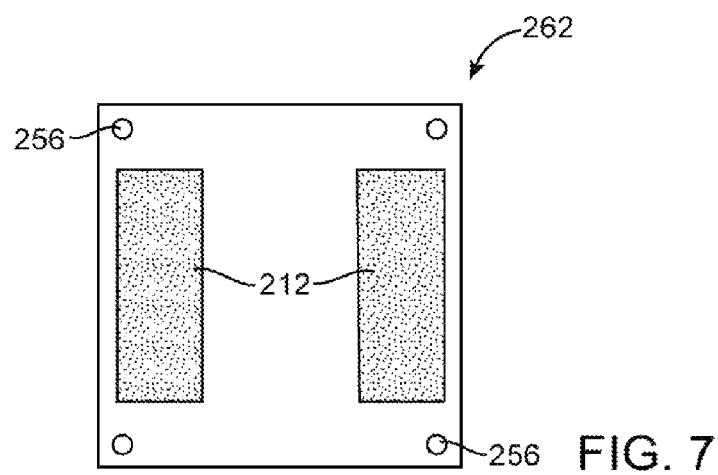
FIG. 7 is a top view of a layer in the package substrate of FIG. 5 that includes ground plane structures aligned to the unfilled regions of FIG. 6 in accordance with an embodiment of the present invention.

A dielectric layer 262 that is subsequently formed on top of dielectric layer 260 having the localized air regions 220 may also include alignment holes 256 for ensuring that ground planes 212 in layer 262 are aligned to the high-speed channel routing regions 252 (see, e.g., FIG. 7). As shown in FIG. 7, alignments holes 256 in layer 262 ensures that the ground planes 212 in layer 262 are properly aligned with region 252 at which the high-speed stripline routing traces are formed so that the ground planes 212 sufficiently cover the localized air regions 220. During manufacturing operations, alignment holes 256 can be formed with relatively high precision and accuracy. Alignment structures such as alignment pin structures may be formed in at least some of the alignment holes to ensure that corresponding holes 256 in the different layers of substrate 122 are properly aligned with respect to one another.

Figure 8A:
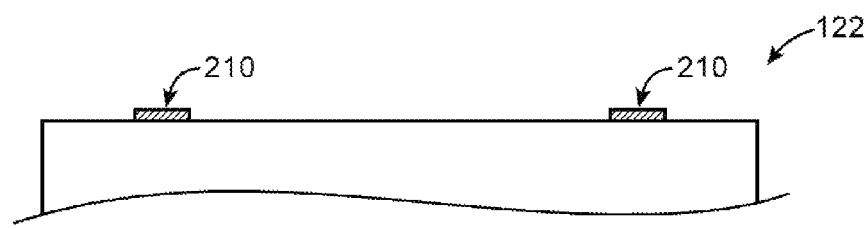
FIGS. 8A-8E are cross-sectional side views illustrating an exemplary process by which a package substrate of the type shown in connection with FIG. 3 can be formed in accordance with an embodiment of the present invention.
Figure 8B:
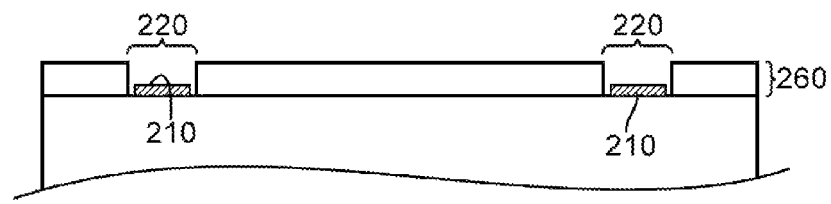

FIGS. 8A-8E are cross-sectional side views illustrating an exemplary process by which package substrate 122 of the type described in connection with FIG. 3 can be formed. As shown in FIG. 8A, conductive signal traces 210 may be formed on a layer of dielectric buildup material. As shown in FIG. 8B, dielectric layer 260 having localized air regions 220 may be formed to only laterally surround the conductive signal traces 210.

Figure 8C:
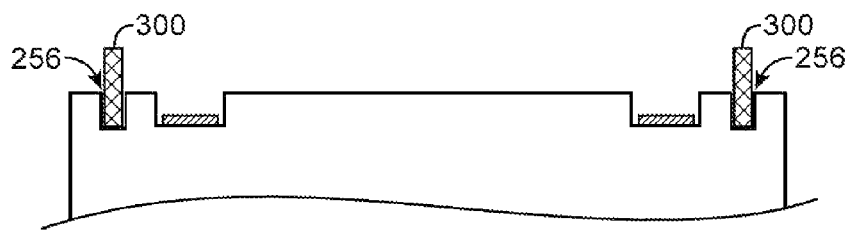

As shown in FIG. 8C, alignment holes 256 may be formed at the corners of layer 260. Alignment structures such as alignment pins 300 may be inserted into alignment holes 256 so that at least a portion of the inserted alignment pins 300 protrudes from the surface of layer 260.

Figure 8D:
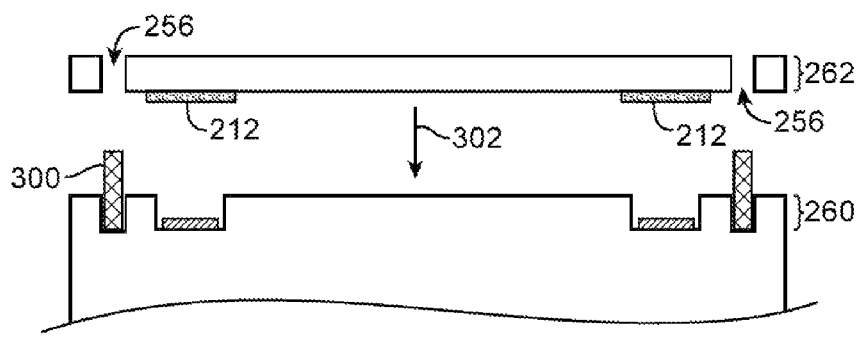
Figure 8E:
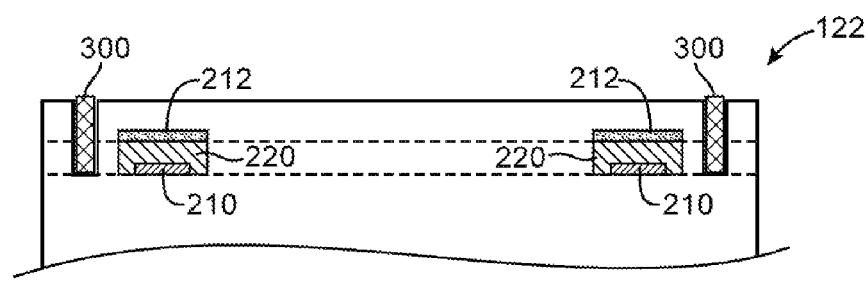

As shown in FIG. 8D, dielectric layer 262 on which ground planes 212 are formed may include alignment holes 256 and may be placed over layer 260 (in the direction of arrow 302). In particular, alignment holes 256 in layer 262 may be aligned with the protruding alignment pin structures 300 to ensure that ground planes 212 are positioned directly over signal routing paths 210 (e.g., to ensure that ground planes 212 overlap completely with air regions 220). FIG. 8E shows the resulting stripline structure in which the area immediately above high-speed signal routing paths 210 is devoid of buildup material. The upper grounding plane 212 should completely cover the localized air regions 220. The bottom grounding plane that is parallel with upper ground plane 212 (which completes the asymmetric stripline structure) is not shown for clarity. If desired, other types of material may be filled in region 220 to help improve high-speed signal routing performance. For example, material with low loss (relative to Ajinomoto's ABF-GX13) and/or low dispersive properties (i.e., materials with frequency independent dielectric constant) may be formed in region 220 between upper grounding plane 212 and high-speed signal conductors 210.

Figure 9:
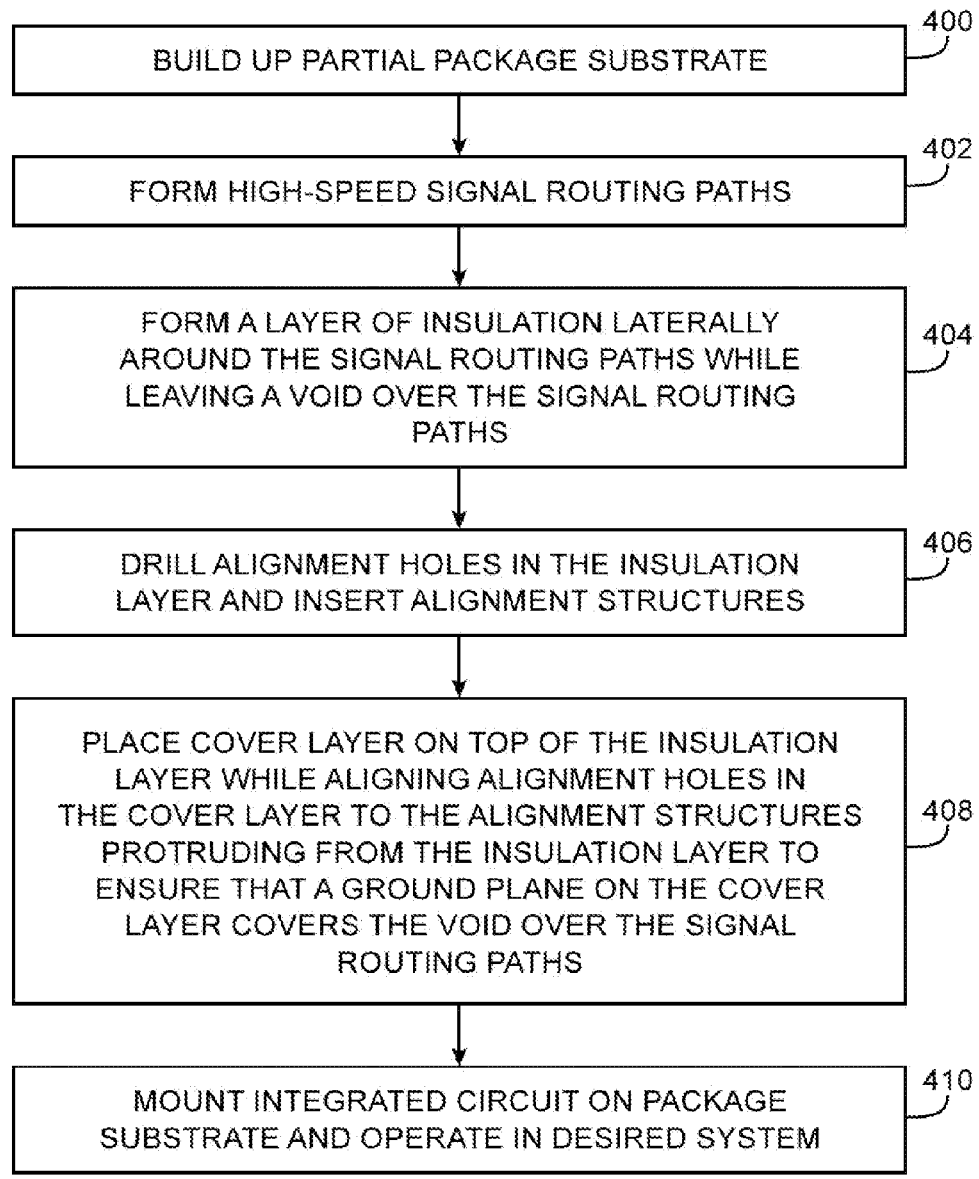
FIG. 9 is a flow chart of illustrative steps involved in fabricating a package substrate with localized air layers in accordance with an embodiment of the present invention.

FIG. 9 is a flow chart of illustrative steps involved in fabricating package substrate 122 with localized air regions. At step 400, package substrate 122 may be partially formed. For example, bottom ground planes 212 of a stripline structure may be formed, but the signal conductors associated with the stripline structure may not yet have been formed. At step 402, signal routing conductors 210 may be formed by disposing a desired pattern of traces on the existing dielectric buildup layer (see, e.g., FIG. 8A).

At step 404, dielectric layer 260 may be formed surrounding the signal routing conductors while leaving a void over the signal routing conductors (see, e.g., FIG. 8B). At step 406, alignment holes may be formed in layer 260 using a laser drilling operation (as an example). Alignment structures such as alignment pin structures may then be inserted within the alignment holes in layer 260 (see, e.g., FIG. 8C).

At step 408, cover layer 262 may be placed on top of dielectric layer 260 while aligning holes 256 in cover layer 262 to the alignment pin structures protruding from the surface of layer 260 (see, e.g., FIG. 8D). Aligning holes 256 in cover layer 262 to the protruding alignment pin structures helps to ensure that upper ground plane 212 covers the void over the signal routing conductors. The resulting structure is shown in FIG. 8E.

At step 410, any remaining circuitry on package substrate 122 may be formed. At least one integrated circuit 10 may be mounted on package substrate 122 and sealed within a housing that is molded from plastic, resin, ceramic, or other suitable materials. A package formed in this way may then be mounted on a printed circuit board and operated in the desired system.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention. The foregoing embodiments may be implemented individually or in any combination.

What is claimed is:

1. An integrated circuit package substrate, comprising:
   a top surface of the integrated circuit package substrate on which an integrated circuit die is mounted;
   a bottom surface of the integrated circuit package substrate;
   a dielectric layer formed between the top and bottom surfaces of the integrated circuit package substrate;
   signal routing conductors formed on the dielectric layer; and
   a localized air region that is formed on the dielectric layer over the signal routing conductors and that is formed between the top and bottom surfaces of the integrated circuit package substrate.

2. The integrated circuit package substrate defined in claim 1, further comprising:
   a first ground plane formed over the localized air region; and
   a second ground plane formed below the dielectric layer, wherein the signal routing conductors are sandwiched between the first and second ground planes, and wherein the signal routing conductors and the first and second ground planes form a stripline structure.

3. The integrated circuit package substrate defined in claim 2, further comprising:
   a plurality of vias arranged in a path that runs parallel to the signal routing conductors and that short the first and second ground planes.

4. The integrated circuit package substrate defined in claim 1, further comprising:
   ground planes that are formed on the dielectric layer and that laterally surround the signal routing conductors.

5. The integrated circuit package substrate defined in claim 1, further comprising:
   a carrier layer that is thicker than the dielectric layer, wherein at least one of the signal routing conductors is coupled to a plated through hole in the carrier layer.

6. The integrated circuit package substrate defined in claim 1, further comprising:
   an additional dielectric layer;
   additional signal routing conductors formed on the additional dielectric layer; and
   another localized air region formed on the additional dielectric layer over the additional signal routing conductors.

7. The integrated circuit package substrate defined in claim 1, wherein the dielectric layer dissipates energy more than the localized air region.

8. The integrated circuit package substrate defined in claim 1, wherein the localized air region has a dielectric constant that is frequency independent.

9. An integrated circuit package substrate, comprising:
a plurality of dielectric layers;
a stripline structure formed in the plurality of dielectric layers, wherein the stripline structure comprises signal conductors formed on at least one of the plurality of dielectric layers and parallel ground planes formed in at least some of the plurality of dielectric layers, and wherein the signal conductors are sandwiched between the parallel ground planes;
alignment holes formed in at least some of the plurality of dielectric layers; and
alignment pin structures formed in the alignment holes configured to ensure that the ground planes completely overlap with the signal conductors.

10. The integrated circuit package substrate defined in claim 9, further comprising:
a die mounting region configured to receive an integrated circuit die.

11. The integrated circuit package substrate defined in claim 9, further comprising:
a given dielectric layer of the plurality of dielectric layers that is formed over the at least one of the plurality of dielectric layers, wherein the given dielectric layer includes a region that is devoid of dielectric material, and wherein the given dielectric layer includes the alignment holes configured to ensure that the region is formed over the signal conductors.

12. The integrated circuit package substrate defined in claim 9, further comprising:
a given dielectric layer of the plurality of dielectric layers that is formed over the at least one of the plurality of dielectric layers, wherein the given dielectric layer includes a region that is filled using material having different characteristics than the given dielectric layer, wherein the given dielectric layer includes the alignment holes configured to ensure that the region is formed over the signal conductors, wherein the material within the region has a dielectric constant that varies with frequency less than that of the given dielectric layer, and wherein the material within the region is less lossy than the given dielectric layer.

13. A method of forming an integrated circuit package, comprising:
forming a first dielectric layer;
forming signal traces on the first dielectric layer;
forming a second dielectric layer over the first dielectric layer, wherein the second dielectric layer includes a region that is devoid of dielectric material, and wherein the region is formed over the signal traces; and
forming a conductive via through the second dielectric layer.

14. The method defined in claim 13, wherein the first dielectric layer has a surface, the method further comprising:
forming alignment holes in the first dielectric layer; and
inserting alignment pins in the alignment holes, wherein the alignment pins protrude from the surface of the first dielectric layer.

15. The method defined in claim 14, wherein forming the second dielectric layer over the first dielectric layer comprises forming alignment holes in the second dielectric layer and placing the second dielectric layer on the first dielectric layer while aligning the alignment holes of the second dielectric layer to the alignment pins to ensure that the region overlaps with the signal traces.

16. The method defined in claim 13, further comprising:
filling the region with additional material, wherein the first dielectric layer attenuates energy more than the additional material.

17. The method defined in claim 13, further comprising:
filling the region with additional material, wherein the first dielectric layer has a dielectric constant that varies with frequency more than that of the additional material.

18. The method defined in claim 13, further comprising:
forming a first ground plane below the first dielectric layer; and
forming a second ground plane above the second dielectric layer, wherein the signal traces and the first and second ground planes collectively form a stripline structure.

* * * * *